(12) United States Patent
Nakano

(10) Patent No.: US 6,825,649 B2
(45) Date of Patent: Nov. 30, 2004

(54) NON-CONTACT VOLTAGE MEASUREMENT METHOD AND DEVICE, AND DETECTION PROBE

(75) Inventor: Koichi Nakano, Nishinomiya (JP)

(73) Assignee: Hokuto Electronics Incorporated, Hyogo (JP)

( * ) Notice: Subject to any disclaimer, the term of this patent is extended or adjusted under 35 U.S.C. 154(b) by 0 days.

(21) Appl. No.: 10/114,994

(22) Filed: Apr. 4, 2002

(65) Prior Publication Data

US 2002/0167303 A1 Nov. 14, 2002

(30) Foreign Application Priority Data

Apr. 4, 2001 (JP) ....................... 2001-105438
Feb. 1, 2002 (JP) ....................... 2002-025253

(51) Int. Cl.$^7$ ............................................. G01R 31/26
(52) U.S. Cl. ..................................... 324/126; 324/158.1
(58) Field of Search ................................. 324/750, 126, 324/127, 158.1, 765, 754

(56) References Cited

U.S. PATENT DOCUMENTS

| | | | |
|---|---|---|---|
| 4,241,373 A | * 12/1980 | Mara et al. | .................... 361/92 |
| 4,714,893 A | 12/1987 | Smith-Vaniz et al. | |
| 5,473,244 A | * 12/1995 | Libove et al. | ............... 324/126 |
| 5,949,230 A | * 9/1999 | Kobayashi et al. | ......... 324/72.5 |

FOREIGN PATENT DOCUMENTS

| | | |
|---|---|---|
| JP | 10-206468 | 8/1998 |
| WO | 99/38019 | 7/1999 |

* cited by examiner

Primary Examiner—Kamand Cuneo
Assistant Examiner—Tung X. Nguyen
(74) Attorney, Agent, or Firm—Birch, Stewart, Kolasch & Birch, LLP

(57) ABSTRACT

It is possible to avoid the effects of floating capacitance, and to measure a voltage with a simple operation and in a non-contact manner, without measuring the floating capacitance. A measurement method for measuring an AC voltage applied to a conductor, without contacting the conductor, using a detection probe, provided with a detection electrode capable of covering part of a surface of insulation for insulating the conductor and a shield electrode for covering the detection electrode, and an oscillator for outputting a signal having a certain frequency, wherein one end of each of a core wire and a sheath wire of a shield cable are connected to the detection electrode and the shield electrode, and a floating capacitance effect is substantially made zero by establishing an imaginary short-circuit state between each of the other ends, the measurement method comprising the steps of measuring impedance between the detection electrode and the conductor by applying the signal from an oscillator to the detection electrode via the shield cable, measuring a current discharged from the detection electrode attributable to the voltage applied to the conductor, and obtaining the applied voltage based on the measured impedance and current.

4 Claims, 14 Drawing Sheets

40

40B

NON-CONTACT VOLTAGE MEASUREMENT METHOD AND DEVICE, AND DETECTION PROBE

BACKGROUND OF THE INVENTION

1. Field of the Invention

The present invention relates to a detection probe respectively used in a method and a device for measuring an AC voltage applied to a conductor insulated by insulation, such as a vinyl insulated electrical wire, without contacting the conductor.

2. Description of the Prior Art

Conventionally, an AC voltmeter is generally used in the measurement of a voltage of a commercial AC current (supply) being applied to an insulated electrical wire.

However, with a method using a conventional AC voltmeter, since it is necessary to bring one measurement electrode into contact with a conductor, it was necessary to cut away part of the insulation of the insulated electrical wire, or to provide a terminal for measurement in advance.

The applicant of the present application has previously proposed a non-contact voltage measurement method and a device that operates at low voltage and is portable (Japanese Patent No. 3158063).

FIG. 13 is a block diagram showing the structure of a non-contact voltage measurement device 80 of the related art, and FIG. 14 is an equivalent circuit of essential parts of the voltage measurement device 80.

In FIG. 13, the voltage measurement device 80 comprises a detection resistor R1, a detection probe 11, an oscillator 12, a current detection section 13j, a band pass filter 21, a rectifier 22, a capacitance calculation section 23, a floating capacitance detection section 24, a switch 25, a low pass filter 26, an integrator 27 and a divider 28.

The detection probe 11 is provided with a detection electrode 111 for electrostatically shielding part of a conductor CD, by covering part of the surface of insulation SL of an electrical wire WR from the outside, and a shield electrode 112 for electrostatically shielding the detection electrode 111 from the outside. Impedance Zw between the detection electrode 111 and the conductor CD is measured using the detection probe 11. In practice, reactance XC1, namely capacitance C1, is measured in place of the impedance Zw.

Composite capacitance due to capacitance between the probe electrode 111 and the shield electrode 112, floating capacitance due to wiring to the detection resistor R1, and other floating capacitance, is made C0, and reactance due to this is made XC0. Capacitance C0 is sometimes referred to as "floating capacitance C0".

Electric current flowing from the oscillator 12 through the detection resistor R1 into the detection electrode 111 is Is, and electric current discharged from the detection electrode 111 towards the oscillator 12 is Ix. Within current Is, there is current $Is_0$ flowing through the floating capacitance C0 to a ground terminal, and a current $Is_1$ flowing through the capacitance C1 and the conductor CD to the ground terminal.

The oscillator 12 outputs, for example, a 5 KHz sine wave signal of a certain voltage Es. The current detection section 13j detects current flowing into the detection electrode 111 and current discharged from the detection electrode 111, and outputs a signal S1.

Within the signal S1 output from the current detection section 13j, the band pass filter 21 allows only a component due to the signal Es of the oscillator 12 to pass. The floating capacitance detection section 24 measures and stores floating capacitance C0 with the detection probe 11 separated from the electrical wire WR. The capacitance calculation section 23 calculates capacitance C1 based on a signal S3 output from the rectifier 22 with the surface of the insulation SL covered by the detection probe 11, and the floating capacitance C0 stored in the floating capacitance detection section 24. The obtained capacitance C1 is output to the divider 28 as a signal S4.

Within the signal S1 output from the current detection section 13j, the low pass filter 26 allows only a component due to the voltage Ex applied to the conductor CD to pass. The integrator 27 integrates a signal S5 output from the low pass filter 26. In this way, phase compensation of the signal waveform is carried out. The divider 28 obtains a voltage Ex by dividing the signal S6 (Erx) output from the integrator 27 by the signal S4 (capacitance C1) output from the capacitance calculation section 23.

First of all, the floating capacitance C0 is measured with the detection probe 11 in an open state. The impedance Z0 seen from the oscillator 12 side is:

$$Z0 = R1 + j\,XCx0$$

but since the detection resistor R1 can be ignored compared to the reactance XC0, the impedance Z0 becomes:

$$Z0 = XC0$$

Accordingly, current $Is_0$ flowing into the floating capacitance C0 due to the signal Es output from the oscillator 12 is:

$$Is_0 = Es/Z0 \quad (1)$$
$$= Es/XC0$$

while a voltage Er across the two ends of the detection resistor R1 due to this current is:

$$Er = Is_0 \times R1 \quad (2)$$
$$= (Es \times R1)/XC0$$

and therefore:

$$XC0 = (Es \times R1)/Er \ C0 = (Es \times R1)/\omega s\cdot Er \quad (3)$$

A value of floating capacitance Co obtained from this equation (3) is stored in the floating capacitance detection section 24. Next, capacitance C1 is measured with the detection probe 11 closed.

The capacitance C1 is increased by the fact that the detection electrode 111 covers the electrical wire WR. Accordingly, impedance Zw seen from the oscillator 12 is:

$$Zw = R1 + j\,XCc \quad (4)$$

provided that, Cc = C0 + C1

Since the detection resistor R1 is small compared to reactance XCc, and can be ignored, $$Zw = XCc$$

Accordingly, current Is flowing into the detection resistor R1 due to the signal Es output from the oscillator 12 is:

$$Is = Es/Zw \qquad (5)$$
$$= Es/XCc$$

while a voltage Er developed across the two ends of the detection resistor R1 by this current is:

$$Er = Is \times R1 \qquad (6)$$
$$= (Es \times R1)/XCc$$

Accordingly, since:

$$XCc=(Es \times R1)/Er$$

and XCc is ωs (C0+C1), $$C0+C1=(Es \times R1)/\omega s \cdot Er \qquad (7)$$

A value of capacitance (C0+C1) obtained from this equation (7) is input to the capacitance calculation section 23 as a signal S3. In the capacitance calculation section 23, capacitance C1 is obtained by subtracting the value of floating capacitance C0 stored in the floating capacitance detection section 24 from the input value of capacitance (C0+C1), and this is output to the divider 28.

Next, a voltage Er developed across the two ends of the detection resistor R1 attributable to the voltage Ex applied to the conductor CD is obtained with the detection probe 11 closed.

Impedance Zx of the circuit through the detection resistor R1 seen from the conductor CD side is:

$$Zx=R1+j \, XC1 \qquad (8)$$

Since the detection resistor R1 is small compared to reactance XC1, and can be ignored, $$Zx=XC1$$

Accordingly, current Ix flowing into the detection resistor R1 due to the voltage Ex applied to the conductor CD is:

$$Ix = Ex/Zx \qquad (9)$$
$$= Ex/XC1$$

A voltage Er developed across the two ends of the detection resistor R1 by this current is:

$$Er = Ix \times R1 \qquad (10)$$
$$= (E \times XR1)/XC1$$
$$= \omega \times XC1 \times (Ex \times R1)$$

A value of voltage Er (Ers) obtained from this equation (10) is input to the divider 28 as a signal S6. The voltage Ex is obtained by the divider 28, by dividing the input voltage Er by a coefficient containing the capacitance C1 output from the capacitance calculation section 23. That is, $$Ex=Er/(\omega x \times C1 \times R1) \qquad (11)$$

is obtained.

However, if the above described voltage measurement device 80 of the related art is used, there is influence from floating capacitance between the detection electrode 111 and the shield electrode 112, and from floating capacitance due to the wiring. For this reason, it is necessary to measure the floating capacitance C0 with the detection probe 11 separated from the electrical wire WR, and time is required for measurement.

Also, the floating capacitance C0 is not fixed and varies depending on the diameter of the conductor CD, conditions of fitting conductor CD to the detection probe 11, conditions surrounding the detection probe 11 etc. Measurement errors arise because of variations in the floating capacitance C0. Overall measurement accuracy is also affected by floating capacitance C0 measurement errors.

Only capacitance C1 was measured as impedance Zw of the insulation SL of the electrical wire WR, but in practice this measurement is affected by leakage resistance of the insulation SL (insulation resistance). Particularly, if the temperature of the electrical wire WR rises, insulation resistance of the insulation SL is lowered, and the effect of this can not be ignored, and this causes measurement errors.

SUMMARY OF THE INVENTION

An object of the present invention is to provide a non-contact measurement method and device, and a detection probe used with this method and device, that is not affected by floating capacitance, and that can measure a voltage in a non-contact manner through a simple operation and without measuring floating capacitance.

According to a first aspect of the present invention, there is provided a method for measuring an AC voltage applied to a conductor, without contacting the conductor, using a detection probe provided with a detection electrode, capable of covering part of a surface of insulation for insulating the conductor, and a shield electrode for covering the detection electrode, and an oscillator for outputting a signal having a certain frequency, wherein one end of each of a core wire and a sheath wire of a shield cable are connected to the detection electrode and the shield electrode, and the effect of floating capacitance is substantially made zero by establishing an imaginary short condition between each of the other ends, comprising the steps of:measuring impedance between the detection electrode and the conductor by applying the signal from the oscillator to the detection electrode via the shield cable;measuring current discharged from the detection electrode attributable to a voltage applied to the conductor; and obtaining the voltage applied to the conductor based on the measured impedance and the measured current.

According to another aspect of the present invention, with respect to the other end of the shield cable, an imaginary short-circuit is established by connecting the core wire and the sheath wire to an inverting input terminal and a non-inverting input terminal of an operational amplifier, and a voltage applied to the conductor is obtained by applying the signal from the oscillator to the detection electrode via the shield cable to measure impedance between the detection electrode and the conductor.

A device of one aspect of the present invention comprises a detection probe, provided with a detection electrode capable of electrostatically shielding part of the conductor by covering part of the surface of the insulation from the outside, and a shield electrode for electrostaticaly shielding the detection electrode from the outside, a shield cable, having one end of a core wire and a sheath wire connected to the detection electrode and the shield electrode, an operational amplifier for, with respect to other ends of the shield cable, establishing an imaginary short circuit condition by connecting the core wire and the sheath wire to an inverting input terminal and a non-inverting input terminal, an oscillator for outputting a signal having a certain frequency, and a measurement section, for applying the signal from the oscillator to the detection electrode via the shield cable to measure impedance between the detection electrode and the conductor, and obtaining the voltage applied to the conductor based on the measured results.

A device of another aspect of the present invention comprises an oscillator for applying a signal having a certain frequency to the detection electrode via the shield cable, a detection resistor, for detecting current discharged from the detection electrode attributable to the signal, and detecting current discharged from the detection electrode attributable to a voltage applied to the conductor, and a measurement section for obtaining the voltage applied to the conductor based on a voltage developed across the two ends of the detection resistor.

There is preferably a correction circuit for correcting an error of the operational amplifier so that the imaginary short-circuit state is made close to perfect.

There is also an inverting amplifier having the signal input to an input terminal, and one end of the detection resistor connected to an output terminal, and forming a feedback circuit by way of an inverting input terminal and a non-inverting input terminal of the operational amplifier.

There is also provided a current detection transformer, provided stretching across a housing and a cover so as to be capable of opening and closing together with opening and closing of the cover.

A detection probe of one aspect of the present invention comprises a housing, a cover capable of being opened and closed with respect to the housing, a detection electrode, provided stretching across the housing and the cover so as to be capable of opening and closing together with opening and closing of the cover, having a movable section that can be pressed by applying force towards the insulation, and being capable of covering a surface of part of the insulation, and a shield electrode for covering the detection electrode, provided stretching across the housing and the cover so as to be capable of opening and closing together with opening and closing of the cover.

In the present invention, in order to measure a voltage applied to a conductor, impedance between the detection electrode and the conductor, and a current discharged from the detection electrode attributable to the voltage applied to the conductor are measured, but this is the principal for obtaining a voltage, and it is not at all necessary to measure those physical amounts. It is possible to measure various other physical amounts or parameters to finally obtain a voltage applied to a conductor.

Also, when measuring impedance between the detection electrode and the conductor, resistance and inductance can normally be ignored, and so it is possible instead to measure impedance by measuring capacitance or reactance. However, to carry out more accurate measurement, measurement is carried out separately for reactance due to capacitance, and leakage resistance connected in parallel with capacitance, and a voltage applied to a conductor is measured using reactance and leakage resistance.

DESCRIPTION OF THE PREFERRED EMBODIMENTS

Hereinafter, the present invention will be explained more in detail with reference to embodiments and drawings.
[First Embodiment]

Figure 1:
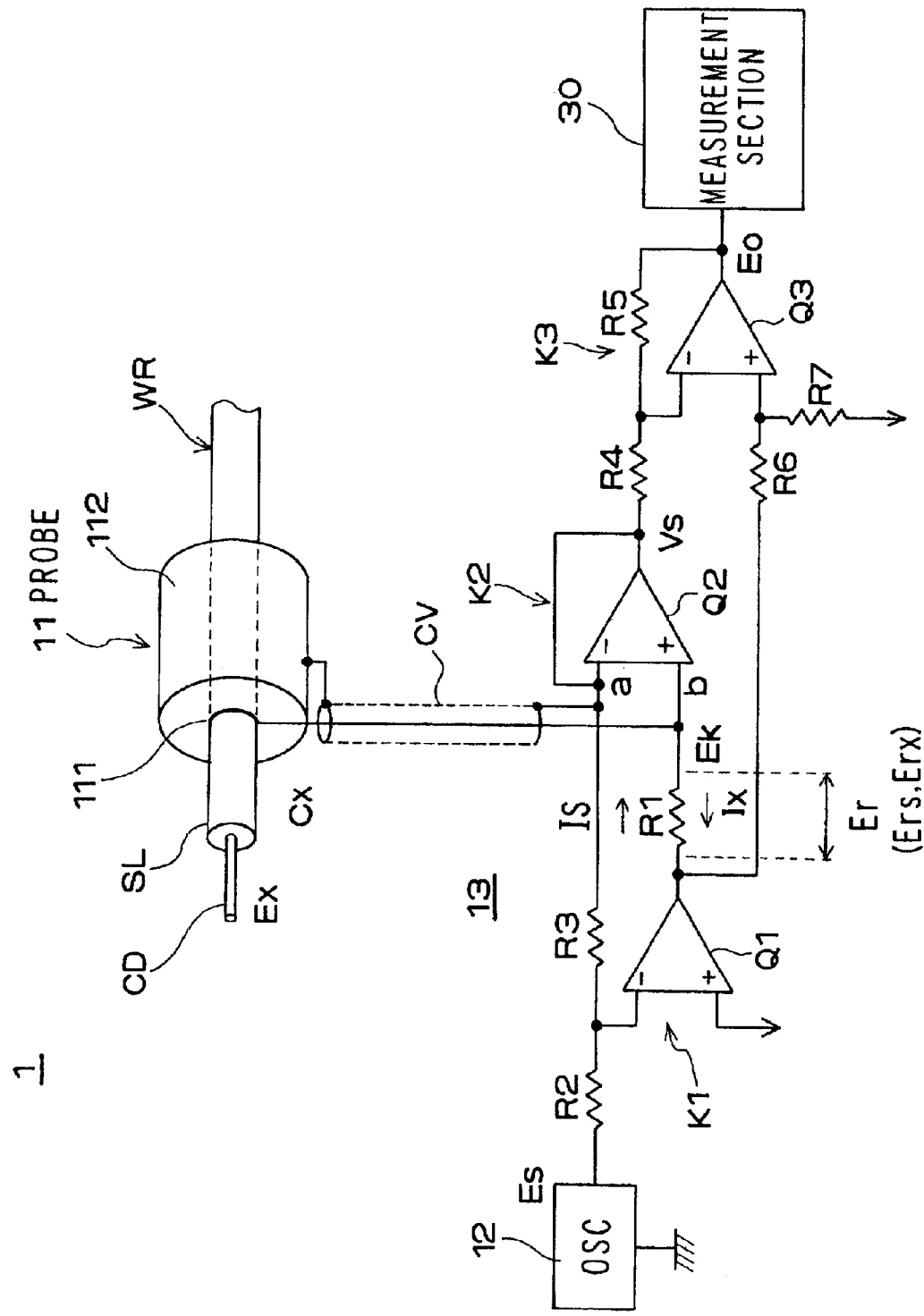
FIG. 1 is a block diagram showing the structure of a voltage measurement device of a first embodiment.
Figure 2:
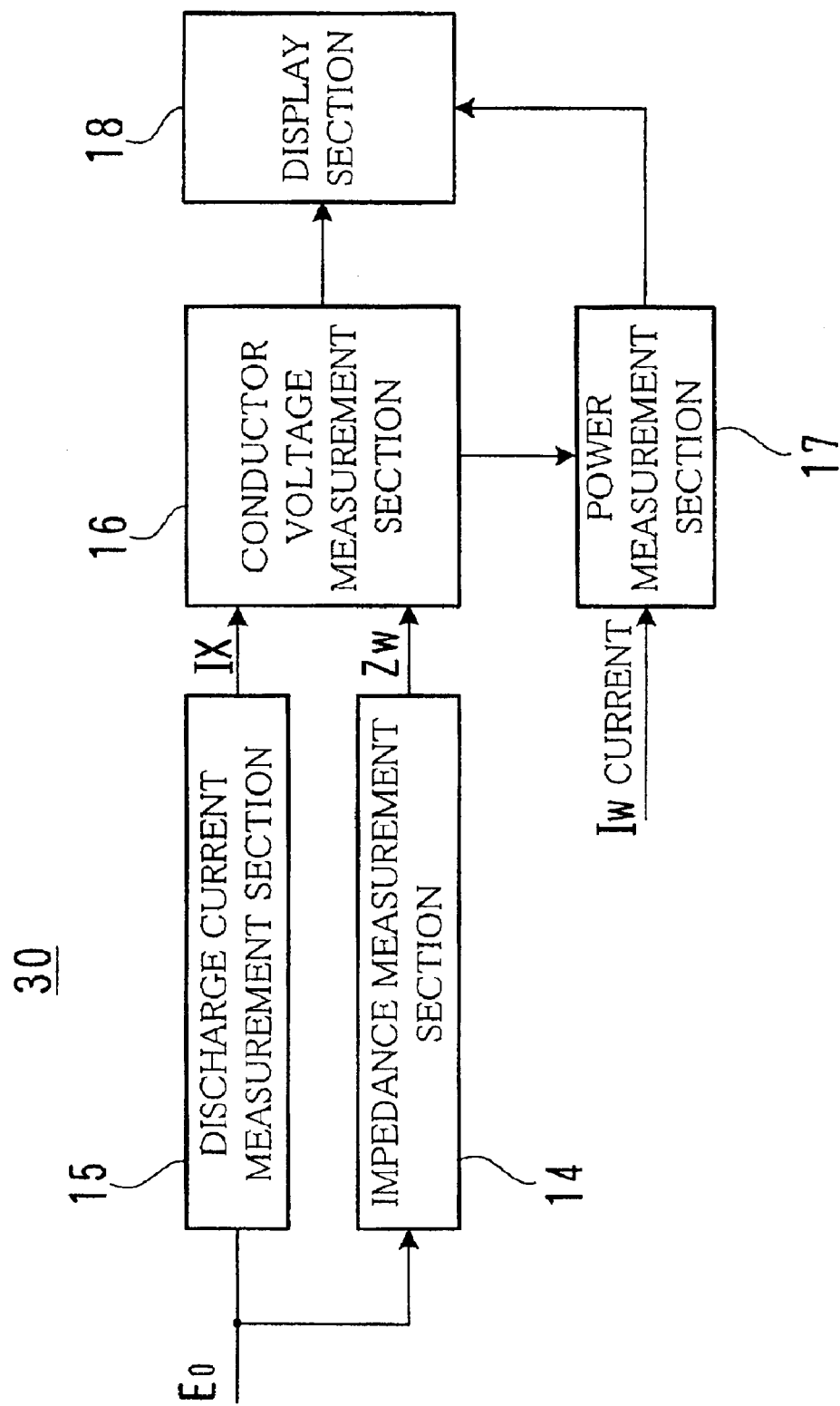
FIG. 2 is a block diagram showing an example of the structure of a measurement section.
Figure 3:
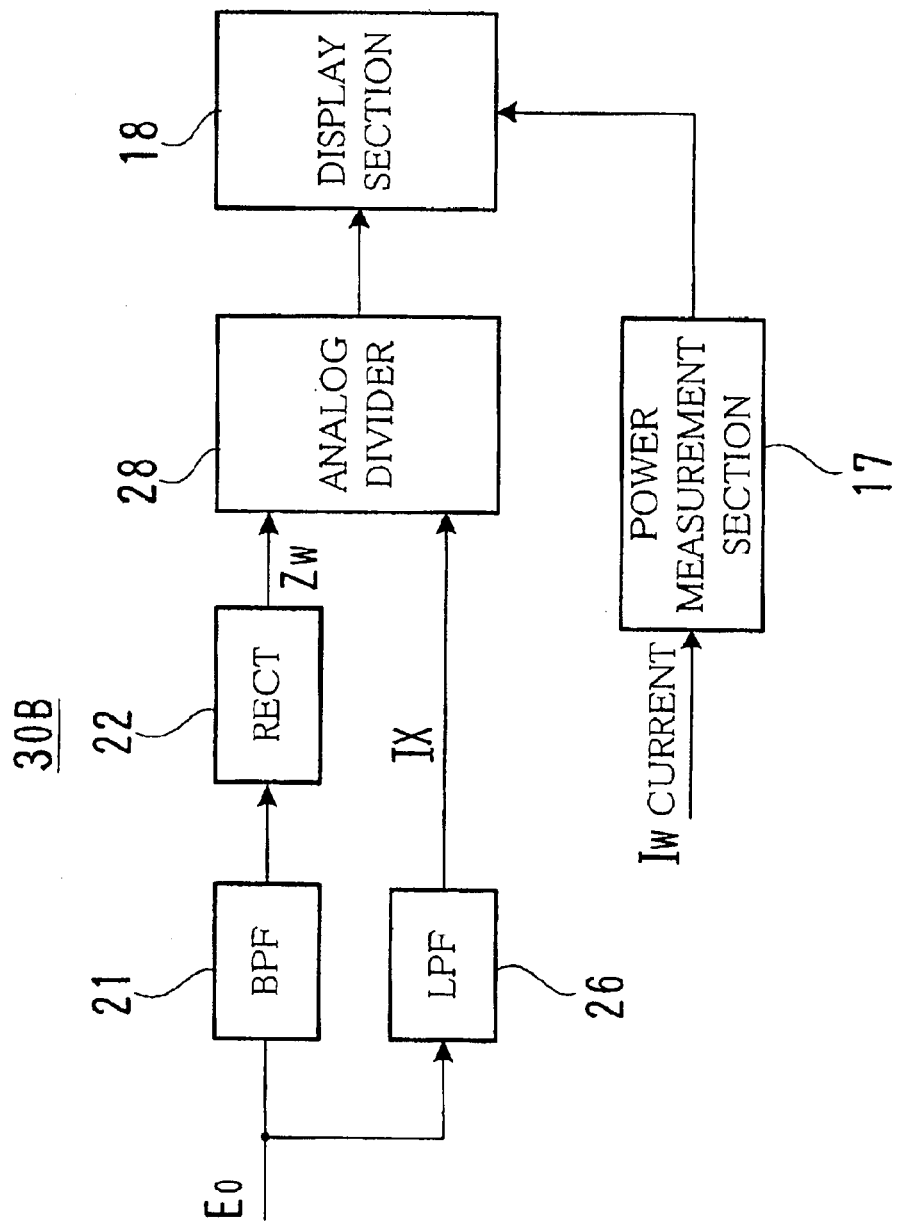
FIG. 3 is a block diagram showing another example of the structure of a measurement section.
Figure 4:
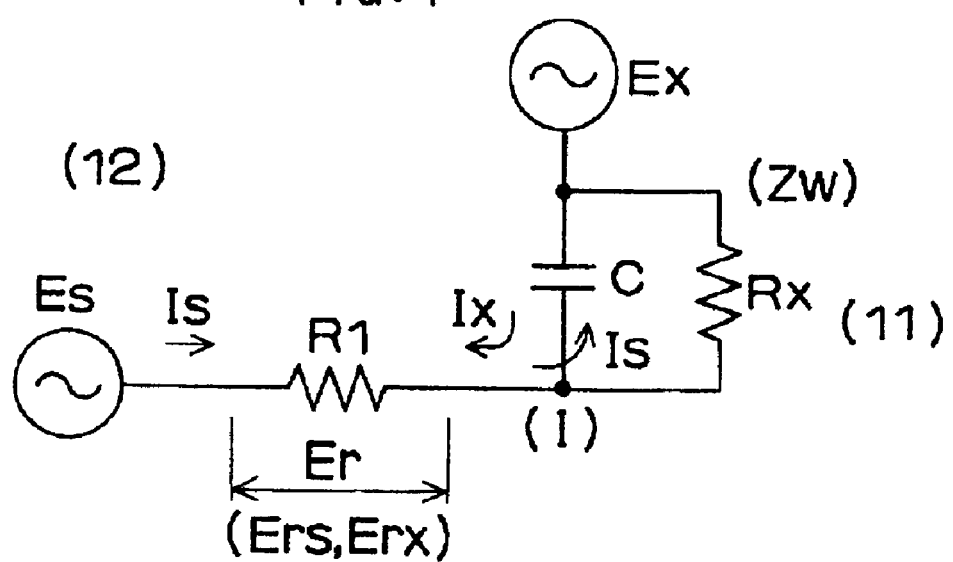
FIG. 4 is an equivalent circuit of essential parts of a voltage measurement device.

FIG. 1 is a block diagram showing the structure of a voltage measurement device 1 of the first embodiment of the present invention, FIG. 2 is a block diagram showing an example structure of a measurement section 30, FIG. 3 is a block diagram showing another example structure of a measurement section 30B, and FIG. 4 is an equivalent circuit of essential parts of the voltage measurement device 1.

In FIG. 1, the voltage measurement device 1 comprises a detection probe 11, a coaxial cable (shield cable) CV, an oscillator 12, a current detector 13 and a measurement section 30.

As the detection probe 11, it is possible to use the same configuration as previously described for the related art.

Specifically, the detection probe 11 is provided with a detection electrode 111 electrostatically shielding part of a conductor CD by covering part of a surface of insulation SL of an electrical wire WR from the outside, and a shield probe 112 electrostatically shielding the detection electrode 111 from the outside.

It is also possible to use an improved detection probe 11B, as will be described later.

The detection probe 11 and the current detection section 13 are connected by the coaxial cable CV. At that time, the detection electrode 111 is connected to a core wire of one side of the coaxial cable CV and the shield electrode 112 is connected to a sheath wire at the same side.

The oscillator 12 outputs a sine wave signal having a frequency that is sufficiently higher than a commercial power supply frequency of 50 HZ or 60 Hz, for example 2 KHz or 5 KHz, and has a certain voltage Es.

The current detection section 13 comprises operational amplifiers Q1–Q3, a detection resistor R1 and resistors R2–R7.

The operational amplifier Q1 forms an inverting amplifier circuit K1. The output terminal and the inverting input terminal a of the operational amplifier Q2 are connected together, and this operational amplifier Q2 constitutes a voltage follower circuit K2. The operational amplifier Q3 forms a differential amplifier circuit K3.

The sheath wire of the coaxial cable CV is connected to the inverting input terminal a of the operational amplifier Q2, while the core wire of the coaxial cable CV is connected to the non-inverting input terminal b. At the voltage follower circuit K2, the inverting input terminal a and the non-inverting input terminal b are at substantially the same potential, that is, they are in an imaginary short-circuit state.

Accordingly, an imaginary short-circuit state exists between the core wire and the sheath wire of the coaxial cable CV, and no current flows between them. That is, floating capacitance existing between the core wire and the sheath wire of the coaxial cable CV can be disregarded and treated as if it was not there.

International publication No. WO99/38019 can be referenced as a method of getting rid of floating capacitance and converting capacitance to a voltage.

As is shown clearly in FIG. 4, current flowing from the oscillator 12 through the detection resistor R1 into the detection electrode 111 is Is, and current discharged from the detection electrode 111 towards the oscillator 12 is Ix.

Impedance Zw between the detection electrode 111 and the conductor CD is measured using the detection probe 11. In practice, reactance XC between the detection electrode 111 and the conductor CD, namely capacitance C, is measured instead of impedance Zw.

Reactance XC is different depending on the frequency f, even if the capacitance C is fixed, and so reactance for frequency fs of the voltage Es from the oscillator 12 will be termed XCs, and reactance for frequency fx of the voltage Ex applied to the conductor CD will be termed XCx.

Here, between reactance XCs and reactance XCx, the relationship $$XCx = (fs/fx) \cdot XCs$$

exists.

In the voltage follower circuit K2 shown in FIG. 1, the potential of the non-inverting input terminal b directly becomes the potential Vs of the output. Because the potential Vs is the output of the inverting amplifier circuit K1 formed by the operational amplifier Q1, $$Vs = -Es\ (R3/R2) \qquad (21)$$

Here, if R3=R2:

$$Vs = -Es \qquad (22)$$

Current Ix flows in the detection resistor R1 due to the voltage Ex applied to the conductor CD. If a drop in voltage due to current Ix is made Er, then $$Er = (Vs+Ex)R1/jXCx \qquad (23)$$

Here, if the four resistors (resistance values) R4–R7 of the differential amplifier circuit K3 are all equal, output voltage Eo of the differential amplifier circuit K3 is $$Eo = Er$$

That is, a voltage Er developed across the two ends of the detection resistor R1 is detected, and outputs from the differential amplifier circuit K3 as voltage Eo.

The voltage Er developed across the two ends of the detection resistor R1 includes a component Erx due to current Ix attributable to the voltage Ex of the conductor CD, and a component Ers due to current Is attributable to the voltage Es output from the oscillator 12. These voltage components Ers and Erx are discriminated using a filter or the like by utilizing characteristics due to the fact that they have different frequencies.

Accordingly, in the measurement section 30, these voltage components Erx and Ers are obtained separately, impedance between the detection electrode 111 and the conductor CD is obtained, and current Ix attributable to the voltage Ex of the conductor CD is measured, and from these values the voltage Ex applied to the conductor CD is measured.

As described above, in this embodiment the capacitance (reactance) is measured as the impedance, but it is also possible to separately measure capacitance C (or reactance XC) and leakage resistance Rx, and to use the measurement results for calculation, as will be described later.

Within voltage Eo, component Eo(Vs) due to the oscillator 12 and component Eo(Ex) due to the voltage Ex of the conductor CD are as follows:

$$Eo(Vs) = -Vs \cdot R1/jXCs \qquad (24)$$

$$Eo(Ex) = Ex \cdot R1/jXCx \qquad (25)$$

These components Eo(Vs) and Eo(Ex) can be obtained through observation. Here, from equation (24), the relationship $$Eo(Vs) = -(Es \cdot R3/R2) \cdot R1/XCs \qquad (26)$$

exists and therefore, $$jXCs = -(Es \cdot R3/R2) \cdot R1/Eo(Es) \qquad (27)$$

thus obtaining XCs.

Also, from equation (25), the relationship $$Ex = jXCx \cdot Eo(Ex)/R1 \qquad (28)$$

exists and from that it is possible to obtain the voltage Ex.

In FIG. 2, the measurement section 30 comprises an impedance measurement section 14, a discharge current measurement section 15, a conductor voltage measurement section 16, a power measurement section 17 and a display section 18. These sections can be realized by executing a suitable computer program, using a microprocessor, ROM, RAM, etc.

The impedance measurement section 14 measures the impedance Zw between the detection electrode 111 and the conductor CD. With this embodiment, only the capacitance C or the reactance XC is measured, for the purpose of simplification. The discharge current measurement section 15 measures current Ix attributable to the voltage Ex. The conductor voltage measurement section 16 measures voltage Ex from the current Ix and the impedance Zw. The power measurement section 17 measures power supplied to a load by the conductor CD based on the measured voltage Ex and input current Iw input separately. The current Iw can be detected by clamping the electrical wire WR using a current detection transformer. The display section 18 displays the measured voltage Ex or power.

In FIG. 3, a measurement section 30B comprises a band pass filter 21, a rectifier 22, a low pass filter 26, a divider 28, a power measurement section 17 and a display section 18.

Within the voltage Eo output from the current detection section 13, the band pass filter 21 allows only a component due to the signal Es of the oscillator 12 to pass. Based on this, the impedance Zw (reactance XCs or reactance XCx) between the detection electrode 111 and the conductor CD is obtained.

The low pass filter 26 allows only a component due to the voltage Ex applied to the conductor CD to pass. Based on this, current Ix attributable to voltage Ex is obtained. The divider 28 performs division to obtain voltage Ex.

Figure 13:
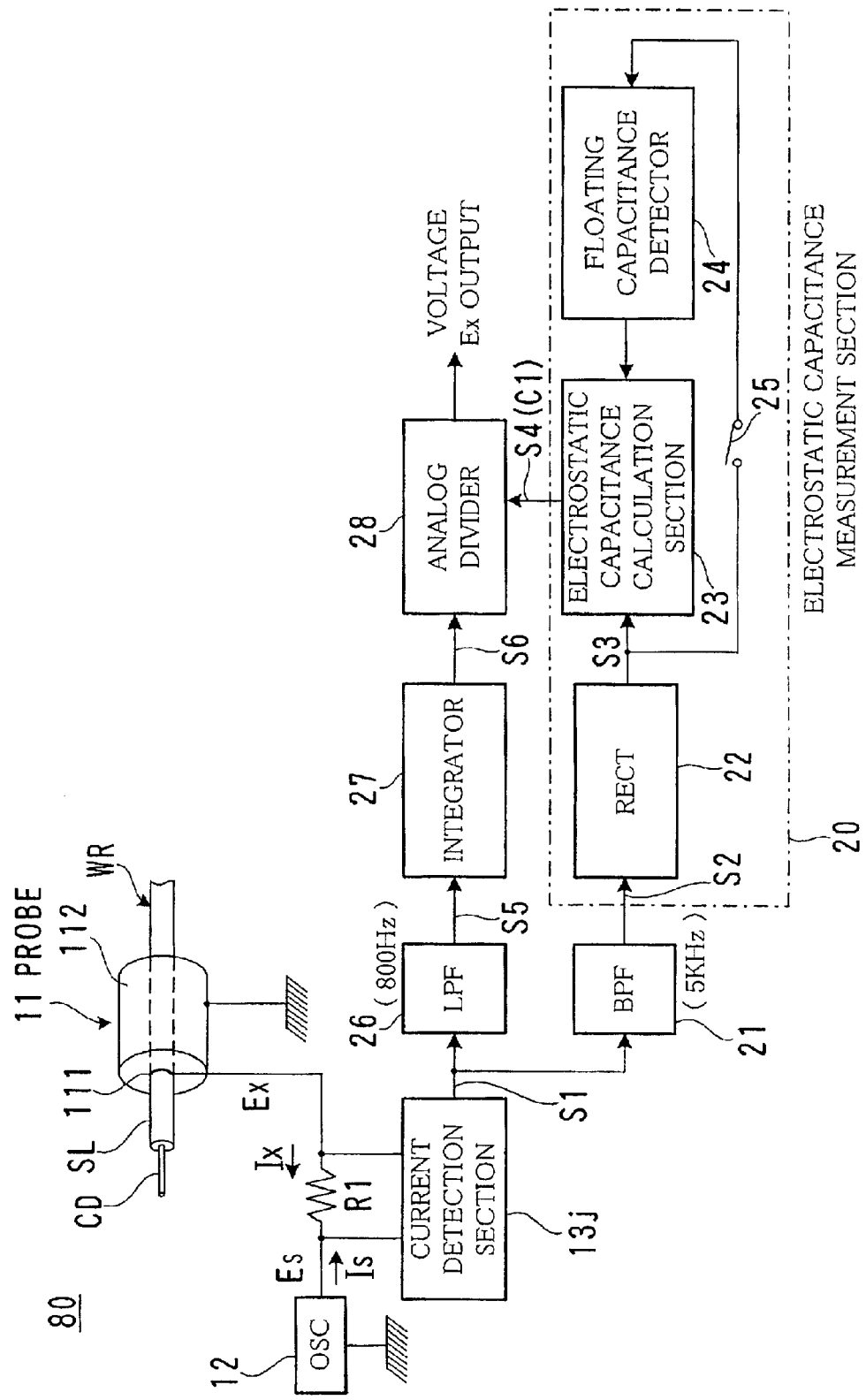
FIG. 13 is a block diagram showing the structure of a non-contact voltage measurement device of the related art.
Figure 14:
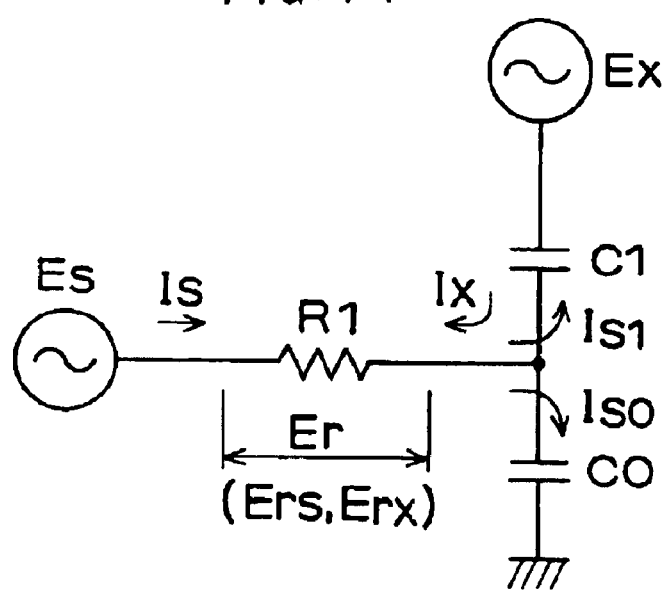
FIG. 14 is an equivalent circuit of essential parts of a voltage measurement device of the related art.

Details of some of the structure and operation of this type of measurement section 30 and measurement section 30B can be found by reference to the specification of the previously mentioned Japanese patent No. 3158063. It is also possible to adopt some of the structure of FIG. 13 described in the related art section.

In this way, with the voltage measurement device 1 of this embodiment, potential between the core wire and sheath wire of the coaxial cable CV is made zero and so no current flows, even if there are various floating capacitances, or variations in the floating capacitance. It is therefore possible to avoid the effects of floating capacitance, and it is possible to measure a voltage of an electrical wire WR with a simple operation and in a non-contact manner, without measurement of floating capacitance and errors arising due to variations in the floating capacitance.

Next, a description will be given with concrete numerical examples.

The voltage Es output from the oscillator 12 is made 1 V and the frequency 2 KHz, voltage applied to the conductor CD is made 100 V and the frequency 60 Hz, Cx=10 pF and R1=1 MΩ. In this case, $$Eo(Es) = -1 \times 10^{15} \times \omega c = 0.126 [V]$$

$$Eo(Ex) = -1 \times 10^6 \times \omega c = 3.77 [mV]$$

Here, with respect to a division coefficient (K) for outputting voltage Ex as 1.00 V, since:

$$1.00 = (3.77 \times 10^{-3} / 0.126) \times K$$

if K is obtained from this, then:

$$K = 0.126 / 3.77 \times 10^{-3} = 33.4$$

That is, if K is made 33.4, then for voltage Ex of 100 V, it is possible to output a voltage Eo of 1 V.

In actually carrying out measurement using the voltage measurement device 1, it is necessary to set the output voltage Eo of the current detection section 13 to zero when there is no electrical wire WR inside the detection probe 11, namely when capacitance C and voltage Ex are zero. However, since actual operational amplifiers Q are not ideal, that operation is erroneous. In order to correct errors due to various other factors, it is necessary to provide a correction circuit to perform fine adjustment of voltage and phase.

It is also necessary to apply the voltage Es or voltage Vs to the sheath wire through a correction circuit for performing fine adjustment of voltage and phase, and not directly, in order to minimize an error in making the potential between the core wire and the sheath wire of the coaxial cable CV zero.

Figure 5:
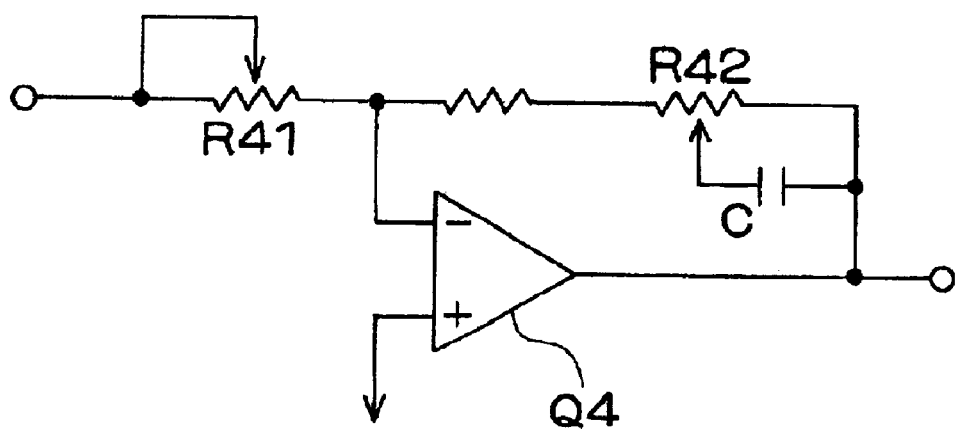
FIG. 5 is a drawing showing an example of a correction circuit.
Figure 6:
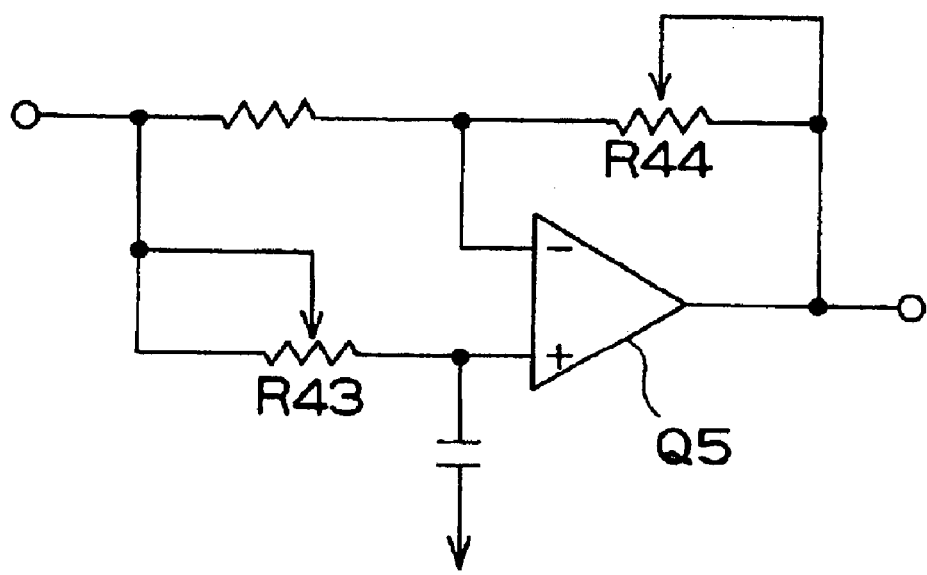
FIG. 6 is a drawing showing an example of a correction circuit.
Figure 7:
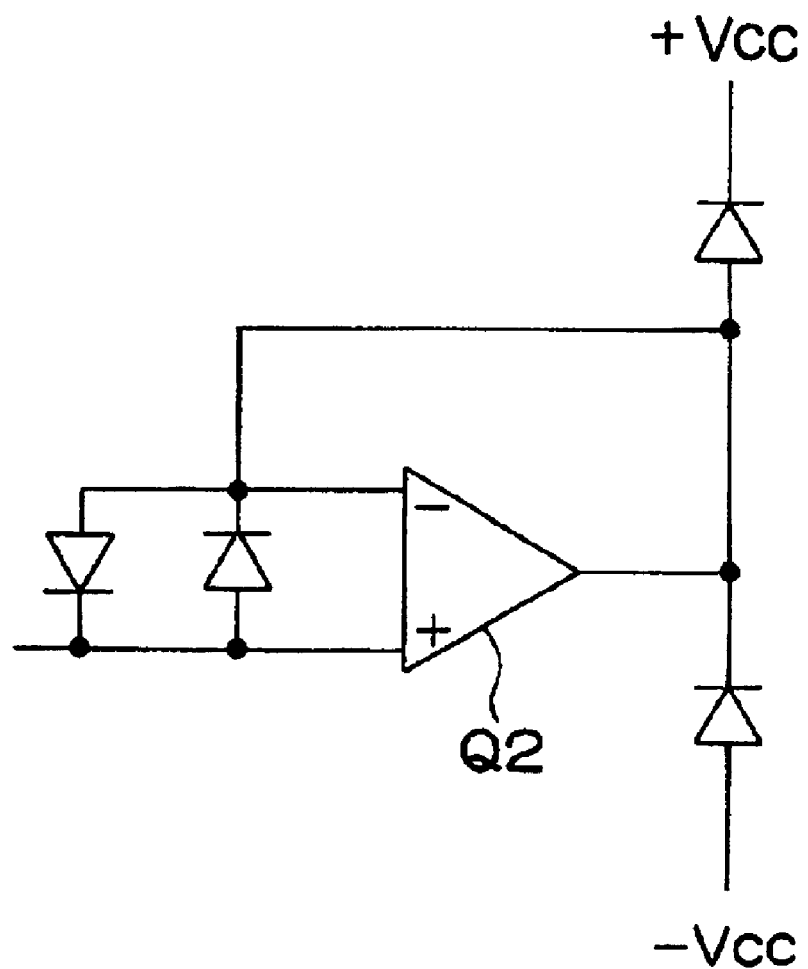
FIG. 7 is a drawing showing an example of a protection circuit.

FIG. 5 and FIG. 6 are drawings showing examples of correction circuits 40 and 40B, and FIG. 7 is a drawing showing an example of a protection circuit.

The correction circuit 40 shown in FIG. 5 is a phase inversion type circuit using an operational amplifier Q4. Amplitude adjustment is carried out by the resistor 41, and phase adjustment is carried out by the resistor R42.

The correction circuit 40B shown in FIG. 6 is a phase non-inversion type circuit using an operational amplifier Q5. Amplitude adjustment is carried out by the resistor 43, and phase adjustment is carried out by the resistor R44.

For example, in the circuit of FIG. 1, the phase non-inversion type correction circuit 40B is inserted between the output of the operational amplifier Q1 and the resistor R6. Also, the phase inversion type correction circuit 40 is inserted at the same position, the other end of the resistor R6 is connected to the inverting input terminal of the operational amplifier Q3, and the operational amplifier Q3 is made to operate as an inverting amplifier circuit.

Also, in the circuit of FIG. 1, the sheath wire of the coaxial cable CV is connected to the inverting input terminal a of the operational amplifier Q2, but the inverting input terminal a is removed, the phase inversion type correction circuit 40B is inserted between the inverting input terminal a of the operational amplifier Q2 and the sheath wire of the coaxial cable CV, and a corrected voltage is applied to the sheath wire of the coaxial cable CV from the output terminal of the operational amplifier Q2.

Also, in order to protect the operational amplifier Q2 from noise on the coaxial cable CV, as shown in FIG. 7, two diodes are connected in parallel in opposite directions between the inverting input terminal a and the non-inverting terminal b of the operational amplifier Q2. A power source is then connected to the output terminal through the diodes.

In the above embodiment, various probes can be used as the detection probe 11. For example, it is possible to use the detection probe disclosed in the specification of the above mentioned Japanese Patent No. 3158063. It is also possible to use the detection probe 11B described in the following.

Figure 8:
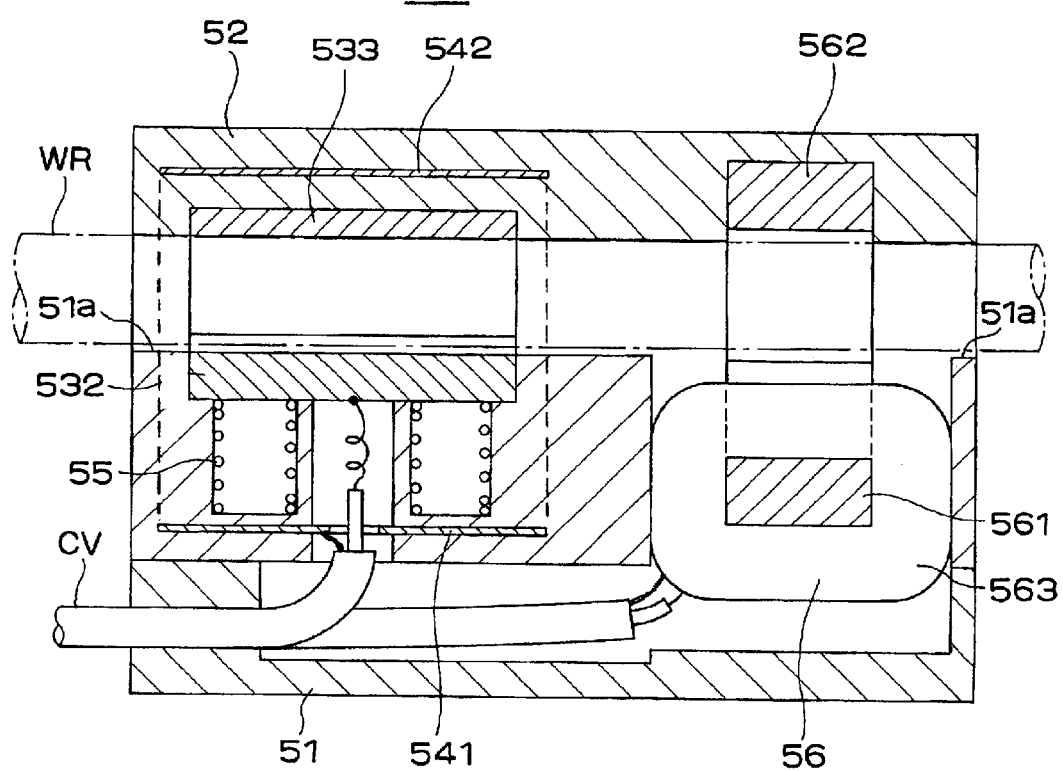
FIG. 8 is a cross-sectional front elevation showing an example of a detection probe.
Figure 9:
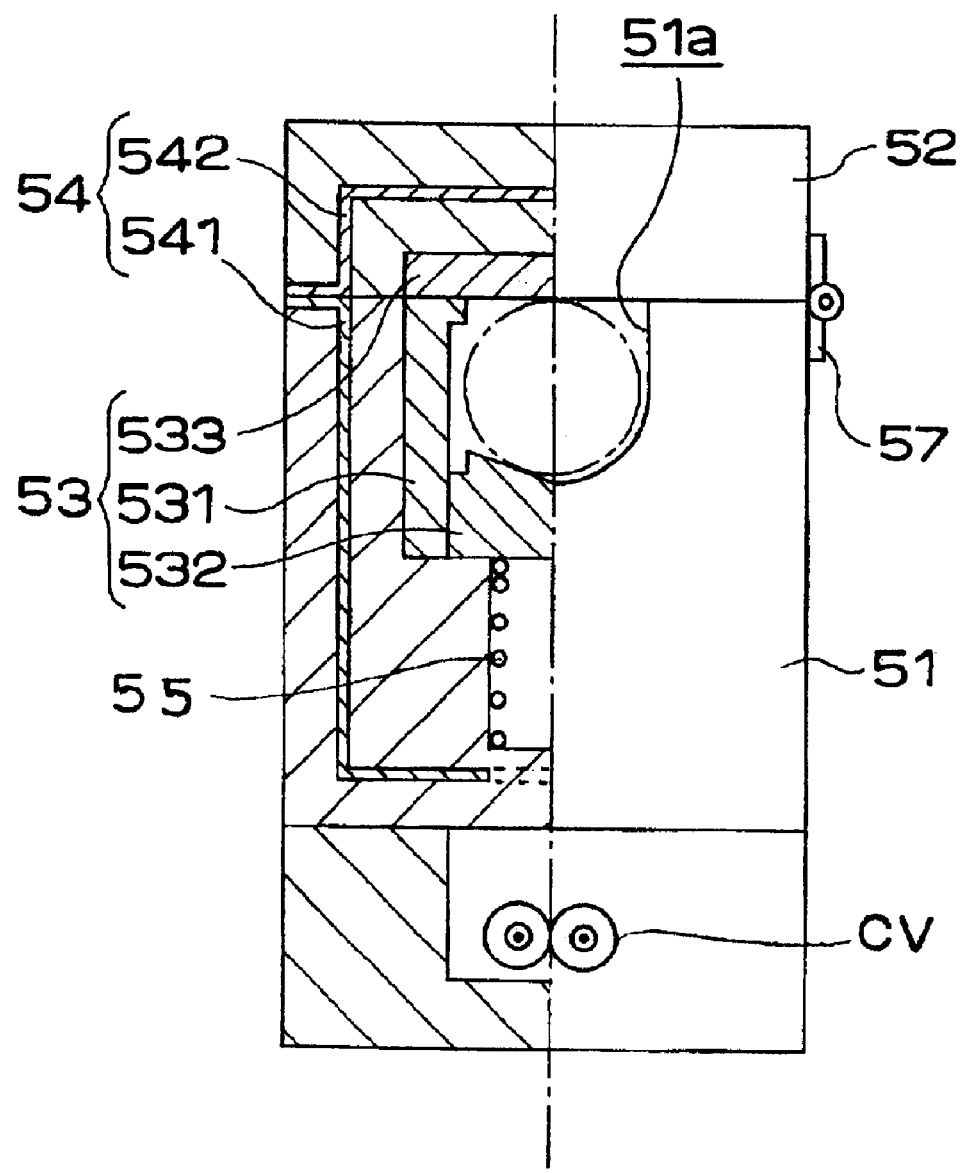
FIG. 9 is a cross-sectional side elevation of a detection probe.

FIG. 8 is a cross-sectional front elevation showing an example of a detection probe 11B, and FIG. 9 is a cross-sectional side elevation of the detection probe 11B.

In FIG. 8 and FIG. 9, the detection probe 11B comprises a housing 51, a cover 52, a detection electrode 53, a shield electrode 54, a coil spring 55 and a current detection transformer 56.

The housing 51 is made of synthetic resin having good insulating properties, and has a substantially rectangular parallelepiped shape. The cover 52 is also made of synthetic resin, and is attached to the housing using a hinge 57 so as to be capable of opening and closing. Openings 51a for passing an electrical wire through are provided centrally at the top of both ends of the housing 51.

With the cover 52 closed, screws or other metal fixtures are attached in order to fasten between the housing 51 and the cover 52 so that the cover 52 does not open.

The detection electrode 53, shield electrode 54 and current detection transformer 56 are formed extending across both the housing 51 and the cover 52.

Specifically, the detection electrode 53 is made up of two parallel side wall sections 531 embedded in the housing 51, a movable bottom section 532 sliding up and down between the two parallel side wall sections 531, and an upper cover section 533 embedded in the cover 52. The movable bottom section 532 has a shallow V-shape formed in its upper surface and is impelled upwards by two coil springs 55 coming into contact with its lower surface, so that it is usually pressed against an electrical wire WR. The side walls 531, movable bottom section 532 and upper cover section 533 touch each other and are electrically connected, and are connected to the core wire of the coaxial cable CV.

The shield electrode 54 is made up of a lower half wall section 541 embedded in the housing 51, and an upper half wall section 542 embedded in the cover 52. The lower half wall section 541 and the upper half wall section 542 are respectively provided with lugs at the end edges, and satisfactorily contact each other when the cover 52 is closed. The sheath wire of the coaxial cable CV is connected to the lower half wall section 541.

The shield electrode 54 is longer in the axial direction than the detection electrode 53. In this way, the shield electrode 54 reliably covers the detection electrode 53.

The current detection transformer 56 has a partial core 561 and a coil 563 provided in the housing 51, and another partial core 562 provided in the cover 52. The core 562 has a cross section that resembles three sides of a square, and the two exposed end surfaces of the core 562 extend to the vicinity of the lower end of an opening 51a. When the cover 52 is closed, the end surface of the partial core 561 and the end surface of the partial core 562 make contact, so that the partial core 561 and the partial core 562 extend all around, enclosing the electrical wire WR. The two ends of the coil 563 are connected to a core wire and a sheath wire of another coaxial cable CV.

In fitting an electrical wire WR into the detection probe 11B, the electrical wire WR is inserted with the cover 52 open to extend between the two openings 51a. The movable bottom section 532 is pressed by the electrical wire WR, and moves downwards against the urging force of the coil spring 55. The cover 52 is then closed and fastened. It is possible to have a gap between the detection electrode 53 and the wire depending on the thickness of the electrical wire WR, but the electrical wire WR has a surface of its insulation covered by the detection electrode 53. Because the movable bottom section 532 presses against the electrical wire WR, the gap can be kept to a minimum even if the thickness of the electrical wire WR varies. Accordingly, the detection probe can be adopted to wires of varying thickness.

Current Iw flowing in the electrical wire WR is detected by the current detection transformer 56, and input to the measurement sections 30 and 30B using the coaxial cable CV. In this way, it is possible to measure power due to the current flowing in the electrical wire WR.

With the above described detection probe 11B, the shield electrode 54 is made angular cylindrical so as to cover the detection electrode 53. However, in this case, the shield electrode 54 does not cover the end surface (both end surfaces for fitting of the electrical wire WR) of the detection electrode 53.

In order for the shield electrode 54 to completely cover the detection electrode 53, the shield electrode 54 is preferably also provided at both end surfaces for fitting of the electrical wire WR.

Figure 10:
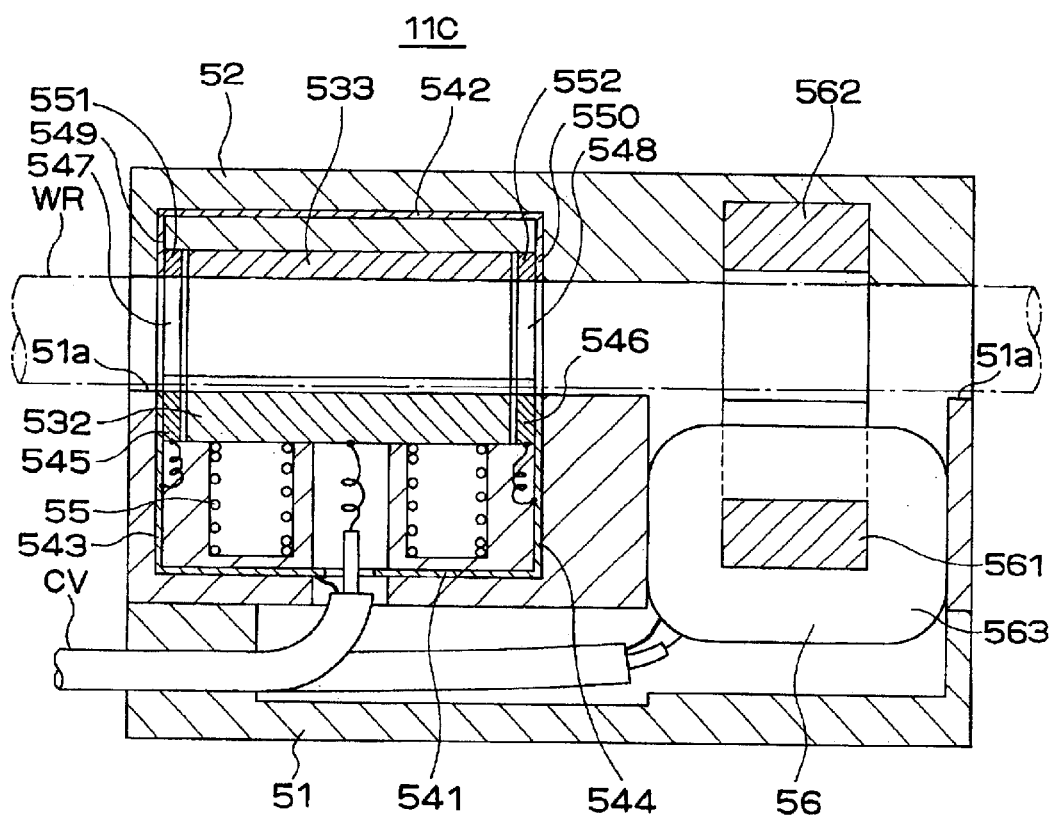
FIG. 10 is a cross-sectional front elevation showing another example of a detection probe.

FIG. 10 is a cross-sectional front elevation showing another example of a detection probe 11C.

As shown in FIG. 10, the detection probe 11C is basically the same as the detection probe 11B shown in FIG. 8, but is different with respect to the structure of a shield electrode 54C.

As shown in FIG. 10, the shield electrode 54C is made up of, besides the lower half wall section 541 and the upper half wall section 542, a lower left side wall section 543, a lower right side wall section 544, a movable left side wall section 545, a moveable right side wall section 546, a left side wall section 547 and a right side wall section 548, all provided in the housing 51, and an upper left side wall section 549, an upper right side wall section 550, a left upper cover section 551 and a right upper cover section 552, all provided in the cover 52.

The lower left side wall section 543 and the lower right side wall section 544 are respectively provided in the housing 51 so as to block off the left end surface or right end surface of the lower half wall section 541, and are connected to the lower half wall section 541. The upper left side wall section 549 and the upper right side wall section 550 are respectively provided so as to block off the left end surface or right end surface of the upper half wall section 542, and are connected to the upper half wall section 542.

The movable left side wall section 545 and the moveable right side wall section 546 are formed in the same shape extending above the movable bottom section 532, and are integrally provided with the movable bottom section 532 through insulation. Therefore, the movable left side wall section 545 and the moveable right side wall section 546 move together with the movable bottom section 532. However, since they are connected to the lower left side wall section 543 or the lower right side wall section 544 via a wire, they have electrically the same potential as the lower left side wall sections 543 and the 544 have.

The left side wall section 547 and the right side wall section 548 are formed in the same shape extending above the side wall section 531, and are provided integrally with the side wall section 531 through insulation. The left side wall section 547 and the right side wall section 548 are connected to the lower left side wall section 543 or the lower right side wall section 544, and are at the same potential as these.

The left upper cover section 551 and the right upper cover section 552 are formed in the same shape extending above the upper cover section 533, and are provided integrally with the upper cover section 533 through insulation. The left upper cover section 551 and the right upper cover section 552 are connected to the upper left side wall section 549 and the upper right side wall section 550, and are at the same potential as these.

That is, part of the electrical wire WR is enclosed in a similar shape to the detection electrode 53 by the movable left side wall section 545, left side wall section 547 and left upper cover section 551, and the moveable right side wall section 546, right side wall section 548 and right upper cover section 552, and the potential of the electrical wire WR is the same as that of the shield electrode 54C.

The periphery of the detection electrode 53 is completely covered by the shield electrode 54C having this type of structure. In this way, external influence and variation in the capacitance between the detection electrode 53 and the shield electrode 54C, namely floating capacitance, is avoided, and it is possible to carry out measurement stably and with high degree of precision.

In the above described embodiment, a single layer coaxial cable CV has been used as the shield cable, but it is also possible to use a double layer coaxial cable. That is, in this case, the core wire is connected to the detection electrode 53, or 111 and the non-inverting input terminal b, and sheath wire of the inner shield is connected to the shield electrode 54, 54C or 112 and the inverting input terminal a, etc. This point is the same as the embodiment described up to now. The sheath wire of the outer shield is then connected to a ground terminal of the voltage measurement device 1. That is, the sheath wire of the inner shield is shielded by the sheath wire of the outer shield, and the sheath wire of the outer shield is grounded. By doing this, no electrical effects are exerted on the inner sheath wire even if the coaxial cable CV is handled or if the surrounding environment of the coaxial cable CV varies, and excellent stability is obtained. However, because current flows due to capacitance between the inner sheath wire and the outer sheath wire, it is necessary to have a drive circuit capable of supplying this current.

[Second Embodiment]

Next, a description will be given of an example for respectively measuring capacitance C (or reactance CX) of a conductor CD and leakage resistance Rx separately.

Figure 11:
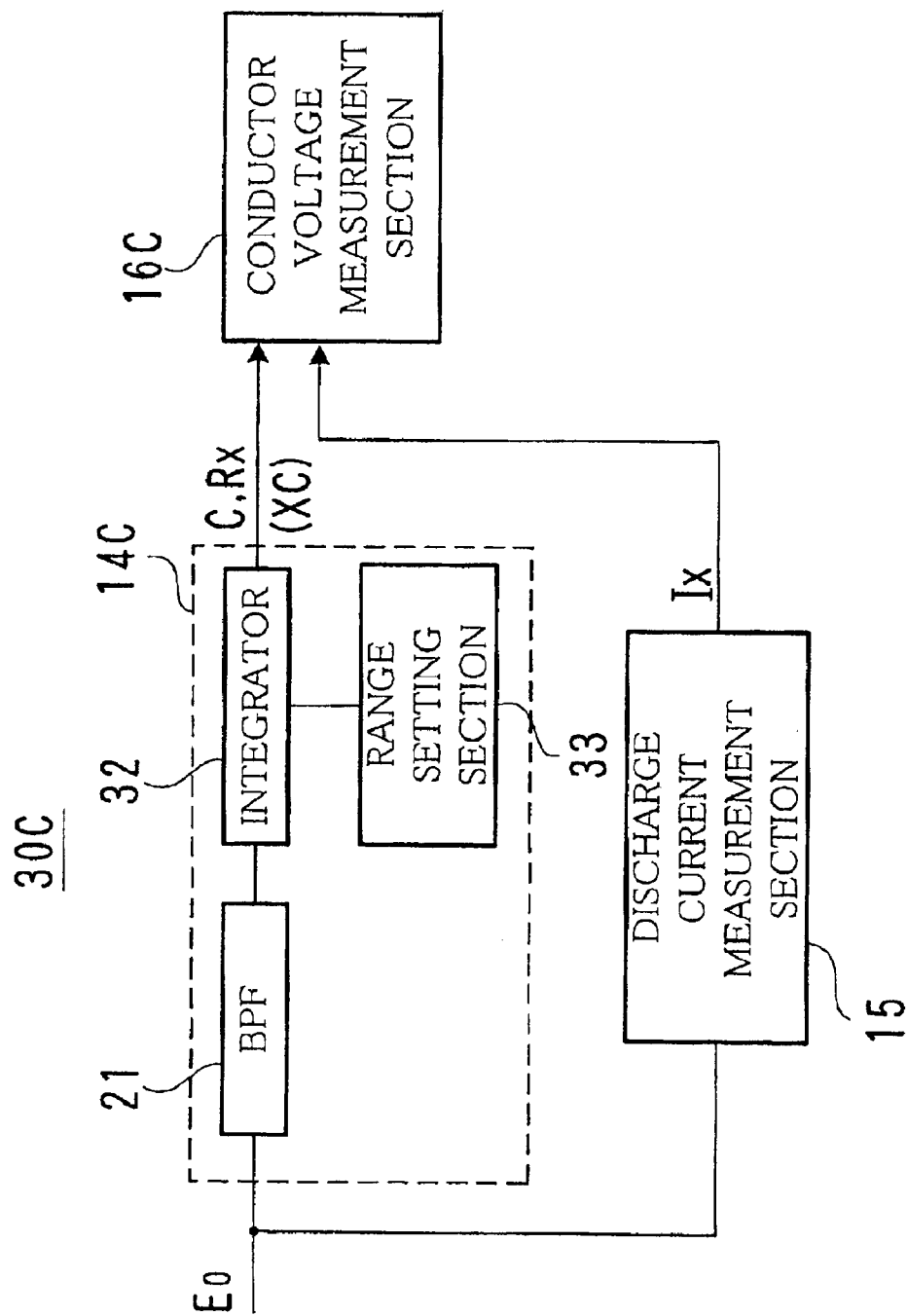
FIG. 11 is a block diagram showing an example of the structure of a measurement section of a second embodiment of the present invention.
Figure 12:
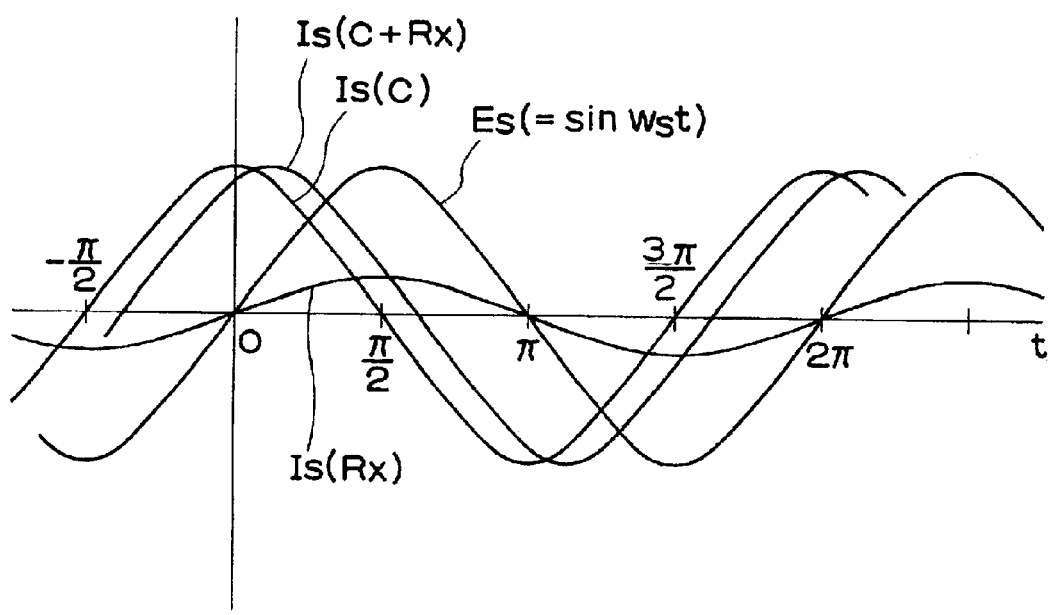
FIG. 12 is a drawing showing a voltage and current phase relationship for respective parts.

FIG. 11 is a block diagram showing an example structure of a measurement section 30C of the second embodiment, and FIG. 12 is a drawing showing a voltage and current phase relationship for each section.

As shown in FIG. 11, the measurement section 30C comprises an impedance measurement section 14C, a discharge current measurement section 15C, and a conductor voltage measurement section 16.

Sections that are not shown in the drawing of the measurement section 30C are the same as in the measurement sections 30 and 30B of the first embodiment. Sections other than the measurement section 30C are also the same as first embodiment. It is also possible to apply the current detection section 13j described in the related art section instead of the current detection section shown in FIG. 1.

The impedance measurement section 14C is made up of a band pass filter 21, an integrator 32 and a range setting section 33.

As described above, within the voltage Eo output from the current detection section 13, the band pass filter 21 allows only a component due to the signal Es of the oscillator 12 to pass.

The integrator 32 separates a component due to capacitance C and a component due to leakage resistance Rx by integrating voltage Eo (that is, voltage Ers) in a certain range.

Specifically, as shown in FIG. 12, current Is(C) flowing in the capacitance C because of the voltage Es of the oscillator 12 has phase advanced $\pi/2$ relative to voltage Es. Current Is(Rx) flowing in the leakage resistance Rx has the same phase as voltage Es. However, since the leakage resistance is normally extremely large (for example about $10^{11}$ Ω), the magnitude of current Is(Rx) is small compared to current Is(C). Accordingly, current Is(C+RX) made by combining these currents has phase slightly delayed compared to current Is(C). Current Is(C+Rx) is the above described current Is, namely:

$$Is=Ers/R1$$

That is, current Is and voltage Ers have the same phase.

By integrating voltage Ers from when the phase of voltage Ers is 0 to when the phase is $\pi$, a component due to current Is (C) becomes zero, and only a component due to current Is(Rx) is extracted. Also, by integrating from when the phase of voltage Es is $-\pi/2$ to when the phase is $\pi/2$, a component due to current Is(Rx) becomes zero, and only a component due to current Is(C) is extracted.

In this way, by setting an appropriate range using the range setting section and respectively performing integration using the integrator 32, a component due to current Is(Rx) and a component due to current Is(C) are separated out. The capacitance C (or reactance XC) and the leakage resistance Rx are output from the impedance measurement section 14C.

The discharge current measurement section 15 measures and outputs current Ix attributable to the voltage Ex.

The conductor voltage measurement section 16C calculates voltage Ex based on output from the impedance measurement section 14C and the discharge current measurement section 15.

A description of the operation of the measurement section 30C described above will now be given using mathematical formulae.

A component Ers due to current Is attributable to voltage Es output from the oscillator 12, and a component Erx due to current Ix attributable to voltage Ex of the conductor CD are expressed as follows:

$$Ers = R1 \cdot Is \qquad (31)$$
$$= R1 \cdot [(Es/Rx) + (Es/XCs)]$$

$$Erx = R1 \cdot Ix \qquad (32)$$
$$= R1 \cdot [(Ex/Rx) + (Ex/XCx)]$$

If voltage Ers is integrated from when the phase of voltage Es is 0 to when the phase is $\pi$, voltage Ers' thus obtained has only a component due to leakage resistance Rx remaining, and becomes:

$$Ers'=(\tfrac{1}{2}^{1/2}) \cdot R1 \cdot Es/Rx$$

From this, $$Rx=(\tfrac{1}{2}^{1/2}) \cdot R1 \cdot Es/Ers' \qquad (33)$$

Also, if voltage Ers is integrated from when the phase of voltage Es is $-\pi/2$ to when the phase is $\pi/2$, voltage Ers'' thus obtained has only a component due to reactance XCs remaining, and becomes:

$$Ers''=(\tfrac{1}{2}^{1/2}) \cdot R1 \cdot Es/XCs$$

From this, $$XCs=(\tfrac{1}{2}^{1/2}) \cdot R1 \, Es/Ers'' \qquad (34)$$

Thus, leakage resistance Rx and reactance XCs are obtained. If reactance XCs is obtained, reactance XCx is obtained from XCx=(fs/fx)·XCs.

Also, from equation (32), $$Ex \; (Erx/R1)/[(1/Rx)+(1/XCx)] \qquad (35)$$

is obtained and so voltage Ex is calculated by substituting the value obtained above into this equation.

By calculating a component due to current Is(Rx) and a component due to current Is(C) separately in this way, precision is improved. Incidentally, in the first embodiment only reactance XCs was measured, but in practice measurement was carried out considering composite impedance of reactance XCs and leakage resistance Rx to be reactance XCs. Accordingly, when converting measured reactance XCs to reactance XCx, leakage resistance Rx is also converted according to frequency ratio, and this causes an error. In the second embodiment, since reactance XCs and leakage resistance Rx are measured separately, reactance XCx and leakage resistance Rx are correctly obtained, and it is possible to accurately calculate voltage Ex.

In the second embodiment, an integrator 32 has been used to separate the reactance XCs and the leakage resistance Rx, but instead of an integral, an average can also be taken. In that case, a coefficient of $(1/2^{1/2})$ is replaced with a coefficient of $(2/\pi)$. These coefficients are examples, and can be made appropriate values depending on an actual circuit or processing contents. The integration or averaging to separate the reactance and the pure resistance is known. It is also possible to achieve separation using other methods. For example, it is possible to separate pure resistance without the effects of frequency by using two signals having different frequencies and utilizing a discrepancy on reactance due to frequency discrepancy.

In the above described embodiments, the measurement sections 30, 30B, 30C etc. can be implemented using hardware circuits, software using a microprocessor, or a combination of software and hardware. The above described operations can be carried out in an analog manner, digitally, or using a combination of the two.

Also, the structure, shape, or material of the detection probes 11, 11B and 11C, the structure of the current detection section 13, measurement sections 30, 30B and 30C, and correction circuits 40 and 4B, the structure of all or respective parts of the voltage measurement device 1, numerical constants, sequence contents and timing of operations, etc. can be appropriately modified in line with the spirit of the invention.

While the presently preferred embodiments of the present invention have been shown and described, it will be understood that the present invention is not limited thereto, and that various changes and modifications may be made by those skilled in the art without departing from the scope of the invention as set forth in the appended claims.

What is claimed is:

1. A non-contact voltage measurement method for measuring an AC voltage applied to a conductor, without contacting the conductor, using a detection probe, provided with a detection electrode capable of covering part of a surface of insulation for insulating the conductor and a shield electrode for covering the detection electrode, and an oscillator for outputting a signal having a certain frequency, wherein one end of each of a core wire and a sheath wire of a shield cable are connected to the detection electrode and the shield electrode, and a floating capacitance effect is substantially made zero by establishing an imaginary short-circuit state between each of the other ends, comprising the steps of:

measuring impedance between the detection electrode and the conductor by applying the signal from the oscillator to the detection electrode via the shield cable;

measuring a current discharged from the detection electrode attributable to a voltage applied to the conductor; and obtaining the voltage applied to the conductor based on the measured impedance and the measured current.

2. The non-contact voltage measurement method of claim 1, wherein, when measuring the impedance, reactance due to capacitance and leakage resistance existing in parallel with the capacitance are measured separately, and the voltage applied to the conductor is measured using the reactance and the leakage resistance.

3. A non-contact voltage measurement method for measuring an AC voltage applied to a conductor insulated by insulation without contacting the conductor, using a detection probe, provided with a detection electrode capable of covering part of a surface of the insulation and a shield electrode for covering the detection electrode, a shield cable, having one end of each of a core wire and a sheath wire connected to the detection electrode and the shield electrode, and an oscillator for outputting a signal having a certain frequency, wherein:

with respect to the other end of the shield cable, an imaginary short-circuit is established by connecting the core wire and the sheath wire to an inverting input terminal and a non-inverting input terminal of an operational amplifier, comprising a step of:

obtaining the voltage applied to the conductor by applying the signal from the oscillator to the detection electrode via the shield cable and measuring impedance between the detection electrode and the conductor.

4. A non-contact voltage measurement method for measuring an AC voltage applied to a conductor, without contacting the conductor, using a detection probe, provided with a detection electrode capable of covering part of a surface of insulation for insulating the conductor and a shield electrode for covering the detection electrode, and an oscillator for outputting a signal having a certain frequency, comprising the steps of:

measuring capacitance or reactance between the detection electrode and the conductor, and leakage resistance existing in parallel with the capacitance, by applying the signal from the oscillator to the detection electrode;

measuring current discharged from the detection electrode attributable to the voltage applied to the conductor; and measuring the voltage applied to the conductor from the current, the capacitance or the reactance and the leakage resistance.

* * * * *